(12) United States Patent
Pearson

(10) Patent No.: US 6,255,871 B1
(45) Date of Patent: Jul. 3, 2001

(54) METHOD AND APPARATUS FOR IMPROVING CAPTURE AND LOCK CHARACTERISTICS OF PHASE LOCK LOOPS

(75) Inventor: William R. Pearson, Salem, VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/479,846

(22) Filed: Jan. 10, 2000

(51) Int. Cl.$^7$ ........................................... H03L 7/06
(52) U.S. Cl. ................................. 327/156; 327/147
(58) Field of Search ................................. 327/146, 147, 327/150, 155, 156, 160; 331/1 A, 17; 375/376

(56) References Cited

U.S. PATENT DOCUMENTS 5,410,573 * 4/1995 Taga et al. ........................... 375/376
5,742,207 * 4/1998 Rambe et al. ......................... 331/11

* cited by examiner

Primary Examiner—Terry D. Cunningham
Assistant Examiner—Quan Tra
(74) Attorney, Agent, or Firm—Carl B. Horton; Kevin T. Duncan; Hunton & Williams

(57) ABSTRACT

A phase lock loop with an improved capture and lock characteristics. A first displacement error signal, a quadrature error signal, and a second displacement error signal are generated, the second displacement error signal combining the benefits of the first displacement error signal and the quadrature error signal to more closely approximate an ideal error signal and avoid false lock.

14 Claims, 5 Drawing Sheets

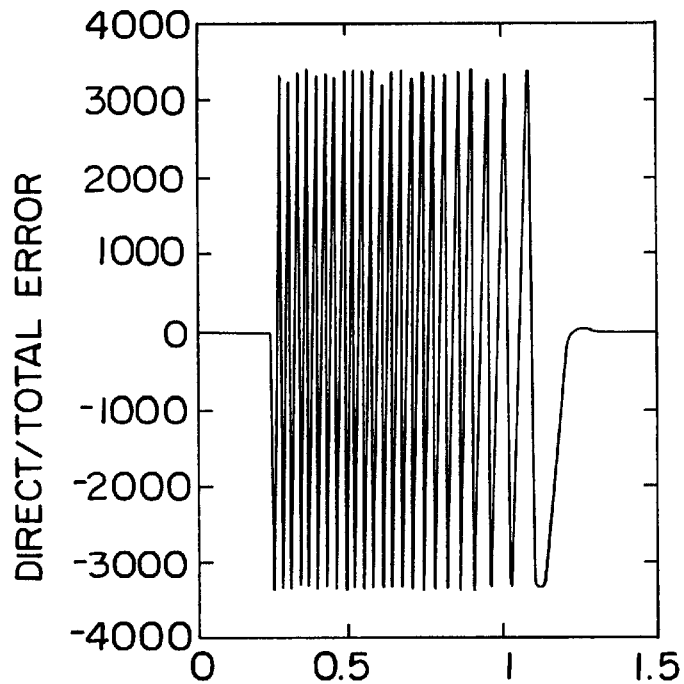
F I G. 4
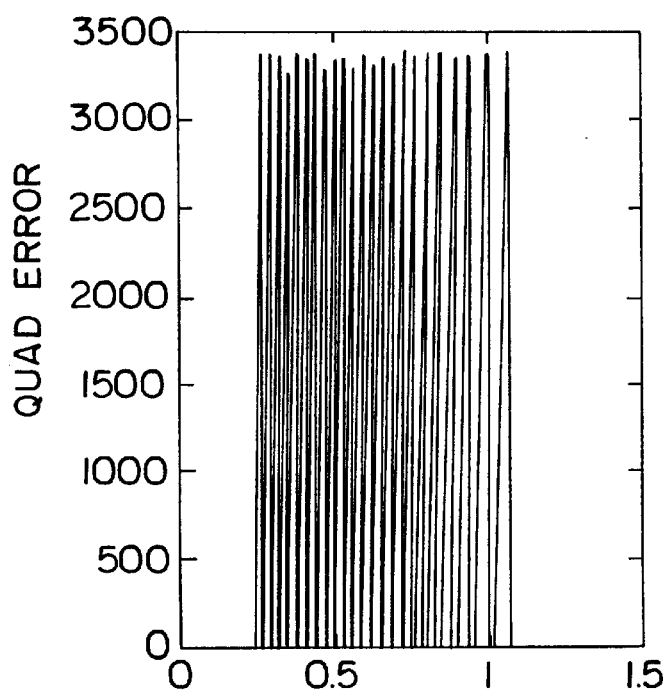
F I G. 5

METHOD AND APPARATUS FOR IMPROVING CAPTURE AND LOCK CHARACTERISTICS OF PHASE LOCK LOOPS

BACKGROUND OF THE INVENTION

The present invention relates generally to phase lock loops. More particularly, the present invention relates to a method and apparatus for improving the capture and lock characteristics of bi-phase phase lock loops.

A phase lock loop (PLL) is a circuit which effectively locks the phases of an input signal and a reference signal. A conventional PLL can be described as a noninductive, tunable active filter with an adjustable bandwidth. When the phase difference between the reference signal and the input signal is constant, the phase loop is locked. If either the input or reference signal changes phase, a phase detector in the PLL will produce an error signal which is proportional to the magnitude and polarity of the phase change. This error signal effects a change in the phase of the reference signal, so that a lock is established once again. PLLs are used in a wide variety of applications, including FM radio demodulation (as the audio signal is simply the error signal), frequency shift keying (FSK) demodulation, frequency synthesis, data synchronization, signal conditioning, and motor speed controls, among other applications. In the field of generator excitation systems, thyristor bridges are used to control the excitation of the generator, and a phase lock loop can be employed to maintain gate control over the thyristor bridges.

Known PLLs do not provide adequate speed and reliability when the phase input to the PLL is reversed. Where there is a relatively large phase change, existing PLLs do not perform satisfactorily and made have a region of error or "false lock".

The angle between two sinusoidal signals may be described by the arctan of one signal divided by the other. PLL's may use an error signal formed by this mathematics to improve locking characteristics but such methods are computationally complex ,require embellishment and are not sufficiently robust for certain applications.

It would be highly desirable to enhance the lock and capture characteristics and range in a phase lock loop, especially for bi-phase phase lock loops such as those used in connection with generator excitation systems. It would further be desirable to increase the linear range of operation of a PLL beyond the 90 degrees of conventional PLLs. It would further be desirable to achieve improved locking without exceeding the original bandwidth of the PLL.

BRIEF SUMMARY OF THE INVENTION

The present invention overcomes the above-noted problems of the prior art, and achieves additional advantages, by providing for a PLL and method which improves locking performance in a computationally simple yet robust manner. According to exemplary embodiments, the error in a phase lock loop is determined by generating a first displacement error signal ed, where ed=Vcos*Cos(phase)+Vsin*Sin(phase), and where Vcos and Vsin are sinusoidal voltage signals; generating a quadrature error signal eq. where eq=−Vcos*Sin(phase)+Vsin*Cos(phase); generating a second displacement error signal ec, where ec=ed, when the quadrature error signal eq is less than or equal to zero, where ec=ed+3*eq, when ed is greater than or equal to zero and eq is greater than zero, and where ec=ed −3*eq, when ed is less than zero and eq is greater than zero; and determining the PLL error using the second displacement error signal ec.

The signal cc replaces the conventional error signal ed to achieve improved PLL capture and lock characteristics in a robust yet computationally simple manner.

BRIEF DESCRIPTION OF THE DRAWINGS

The features and advantages of the present invention will be understood more completely by reading the following Detailed Description in conjunction with the accompanying drawings, in which:

FIGS. 4–7 shows MATLAB simulations comparing conventional locking technique with an implementation of the present invention.

DETAILED DESCRIPTION OF THE INVENTION

Figure 1:
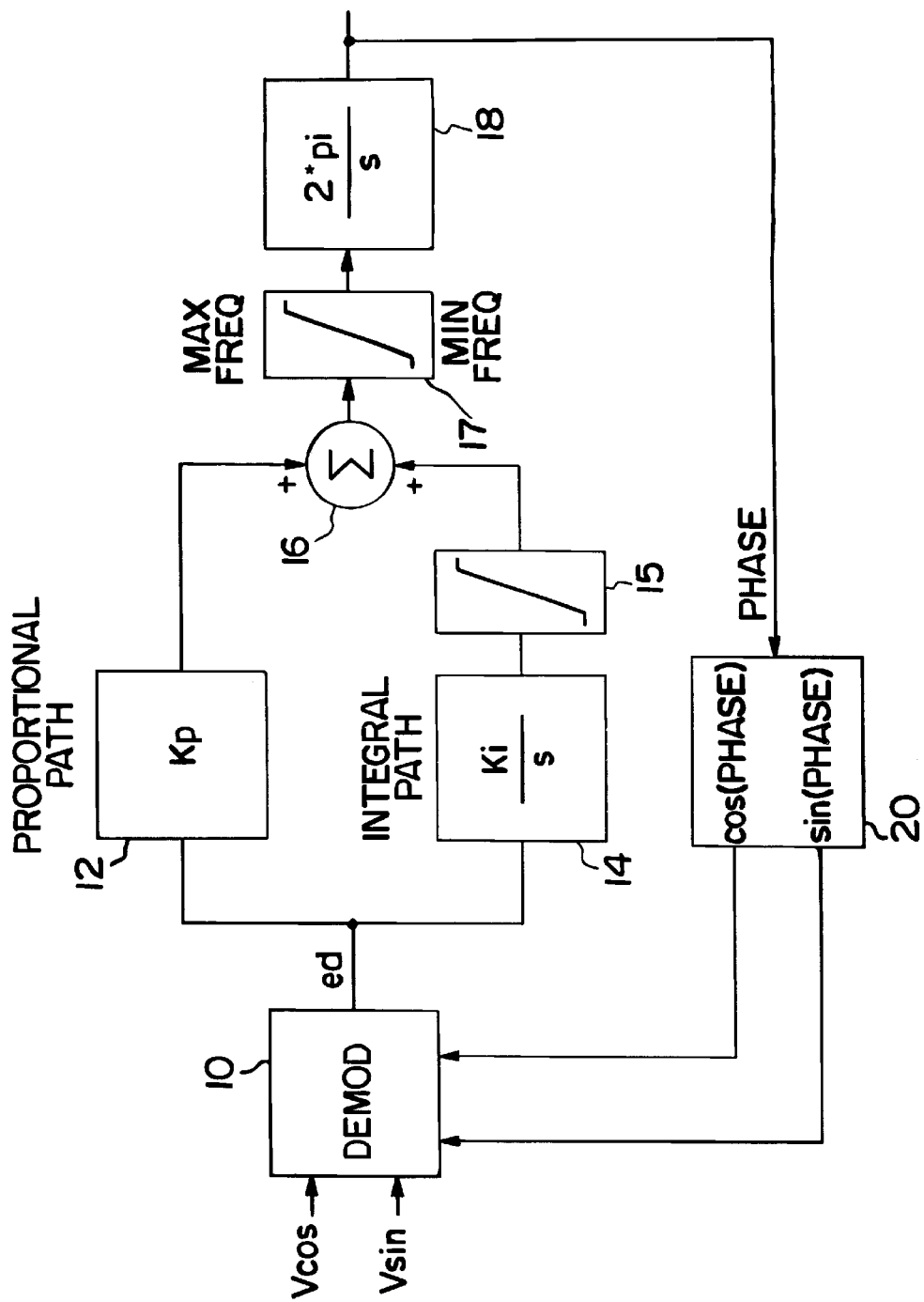
FIG. 1 is an example of a bi-phase phase lock loop suitable for implementing the present invention.

Referring now to FIG. 1, a bi-phase phase lock loop (PLL) suitable for implementing the present invention is shown. A demodulator 10 is connected to receive inputs Vcos and Vsin, which are sinusoidal voltage signals offset from each other by approximately 90 degrees. The demodulator 10 is also connected to receive cosine and sine phase signals from a feedback loop which will be described later in more detail. Based on these input signals, the demodulator 10 generates an error signal ed, which in conventional PLLs is typically defined as:

$$Ed=Vcos*Cos(phase)+Vsin*Sin(phase) \tag{1}$$

That is, the demodulator 10 generates and sums these products, and outputs the result as the error signal ed. The signal ed is then processed in two separate, parallel paths. In a proportional path, the error signal ed is supplied as an input to an amplifier 12, which linearly amplifies the error signal ed by a gain factor Kp. Kp is conventionally set to achieve a desired bandwidth for the loop. In an integral path, the error signal ed is provided to an integrator 14 (where s is the Laplace operator)., which integrates the error signal using an integration factor of Ki. Ki is conventionally set to achieve zero phase error in the steady state within a desired settling time . The integrated error signal may be limited in limiter 15. The amplified and integrated error 10 signals from the proportional and integral paths, respectively, are provided as inputs to a summer 16, which arithmetically sums the signals to generate a summed output. The summed output can be limited in limiter 17, and then is provided to a second integrator 18, which integrates the summed output using an integration factor of 2 pi. This factor of 2 pi only implies a scaling from hertz to radians per second. The integrated summed signal is provided as the output of the PLL, and represents a phase error between the input sinusoidal signals.

The output of the PLL is also provided to a feedback loop as shown in FIG. 1. More particularly, the output phase is provided to a processing unit 20 which generates a cosine and a sine value of the output signal, and provides the cosine and sine values as an input to the demodulator 10. The cosine and sine values are used to determine the error signal ed as described above.

Figure 2:
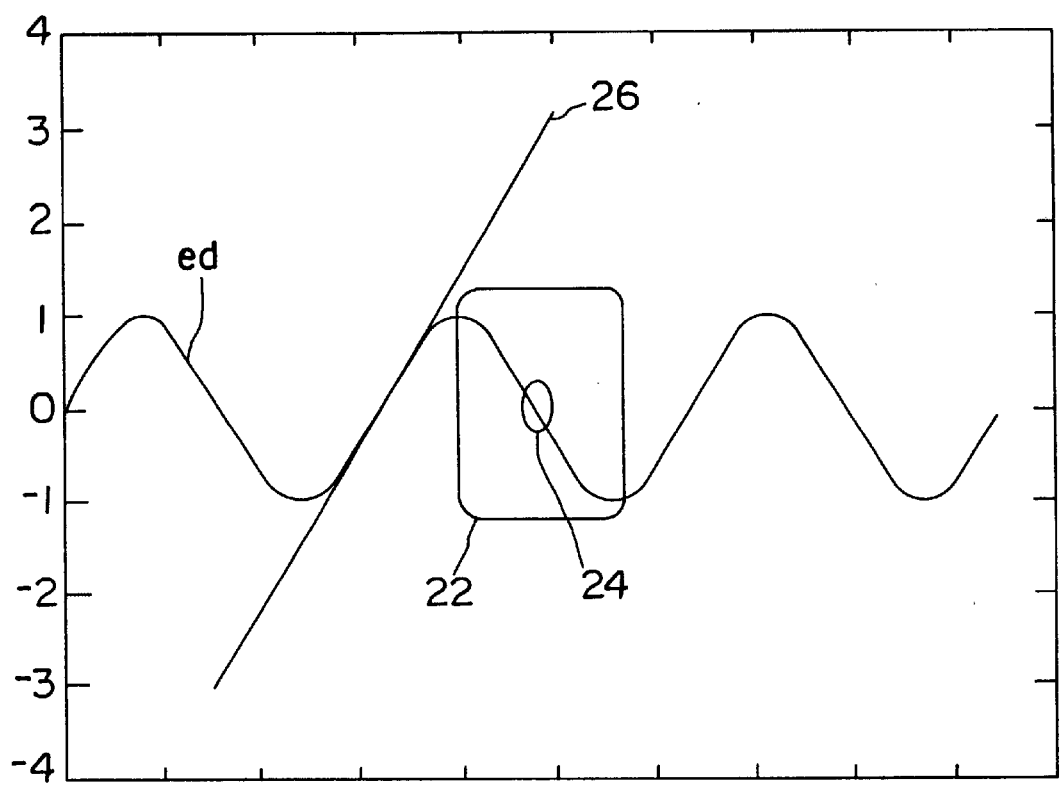
FIG. 2 is a graphical depiction of the error characteristics of the PLL of FIG. 1 using a conventional locking technique.

Referring now to FIG. 2, a graphical depiction of the PLL error characteristics of the PLL of FIG. 1 is shown. The signal ed is the original direct PLL error signal, and is sinusoidal in nature. The error characteristics include an astable region 22, and a region 24 in which relatively slow recovery can be expected in the event of a phase change, since there is little error in the region 24. This is referred to as a "false lock". The desired linear characteristic 26 is also depicted in FIG. 2.

According to an embodiment of the present invention, the capture and lock characteristics shown in FIG. 2 can be improved significantly using the following technique. In addition to generating a first displacement error signal ed as in equation (1) above, a quadrature error signal eq is generated according to the equation eq=−Vcos*Sin(phase)+Vsin*Cos(phase). Using these two signals ed and eq, a second displacement error signal ec is generated (e.g., in the demodulator 10 of FIG. 1) according to the following parameters:

ec=ed when eq≦0;

ec=ed+3eq when ed≧0 AND eq>0; and ec=ed−3eq when ed<0 AND eq>0.

According to this embodiment, the second displacement error signal ec replaces the first displacement error signal ed in FIG. 1. The second displacement error signal cc provides one example of an approximation to an ideal or desired linear characteristic. This example is computationally simple, yet robust and highly effective, as will be demonstrated with respect to FIG. 3.

Figure 3:
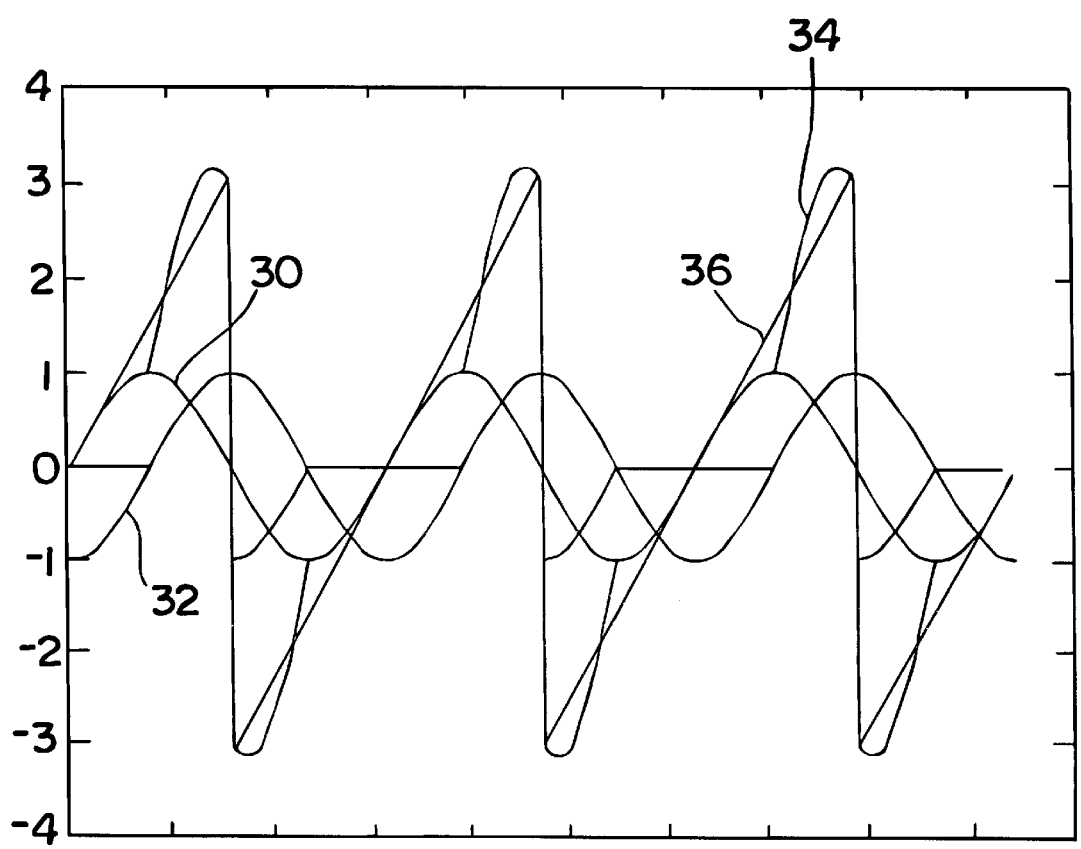
FIG. 3 is a graphical depiction of the error characteristics of the PLL of FIG. 1 using a technique according to the present invention.

FIG. 3 is a graphical depiction of PLL error of FIG. 1 using the technique just described. FIG. 3 shows the first displacement error signal ed as signal 30, quadrature error signal eq as signal 32, and second displacement error signal ec as signal 34. An ideal error signal is shown as waveform 36. As can be seen from this depiction, the second displacement error signal, though relatively simple, closely approximates the ideal error signal 36.

Figure 6:
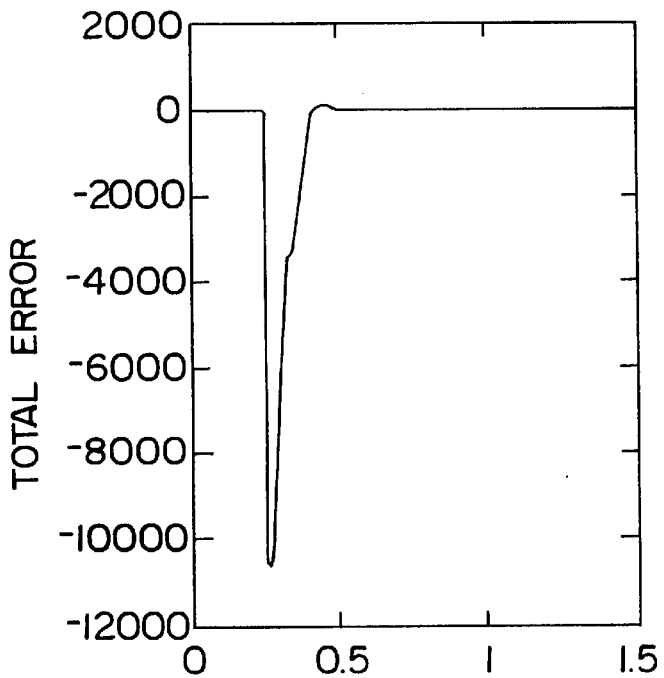
Figure 7:
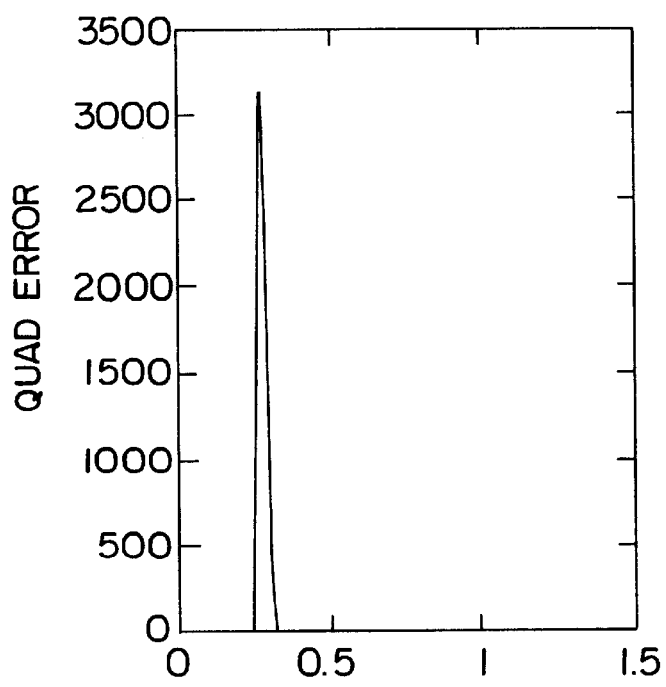

Referring now to FIGS. 4–7, simulations using a MATLAB simulator are shown for a PLL for a 60 Hz line setting the integral path of the controller to 100 Hz. FIG. 4 shows the result of a disturbance introduced into the integral path of the PLL of FIG. 1 using only the conventional error signal ed. FIG. 5 shows the quadrature error signal of the same disturbance in the same PLL. FIG. 6 shows, the same disturbance, the total error for the same PLL using the second displacement error signal ec. FIG. 7 shows, for the same disturbance, the quadrature error signal for the same PLL. It should be appreciated that the use of the second displacement error signal ec significantly improves the capture and lock characteristics of the same PLL under large signal conditions in the example shown in FIGS. 4–7. It should also be appreciated that the use of the second displacement error signal ec does not substantially affect the total error, compared to the use of only the first displacement error signal ed, until the phase error exceeds approximately ninety degrees. Eq is negative upto this 90 degree point and by prior explanation eq is not used to form part of ec until eq is positive. Thus, the second displacement error signal ec effectively represents a supplementary signal which can be used to extend the linear range of operation of the PLL beyond the use of only the first displacement error signal ed.

The foregoing description includes many details, which should not be construed as limitations of the invention. Many of the described details can be varied without departing from the scope of the invention, as defined by the following claims and their legal equivalents.

What is claimed is:

1. A method for determining error in a phase-lock loop, comprising the steps of:

generating a first displacement error signal ed, where ed=Vcos*Cos(phase)+Vsin*Sin(phase), and where Vcos and Vsin are sinusoidal voltage signals;

generating a quadrature error signal eq, where eq= . . . Vcos*Sin(phase)+Vsin*Cos(phase);

generating a second displacement error signal ec, where ec=ed, when the quadrature error signal eq is less than or equal to zero, where ec=ed+X* eq, when ed is greater than or equal to zero and eq is greater than zero, and where ec=ed−X*eq, when ed is less than zero, eq is greater than zero, and X a multiplying factor; and determining error in the phase-lock loop using the second displacement error signal.

2. The method of claim 1, wherein the sinusoidal voltage signals Vcos and Vsin are approximately 90 degrees apart.

3. The method of claim 1, wherein X is 3.

4. The method of claim 1, wherein the step of determining is performed by the steps of:

providing the second displacement error signal ec to a proportional path where the error signal ec is amplified by a gain factor;

providing the second displacement error signal ec to an integral path where the error signal ec is integrated;

summing the amplified and integrated signals to generate a summed signal; and performing a second integration of the summed signal to generate an output indicative of the error in the phase-lock loop.

5. A phase lock loop, comprising:

a demodulator connected to receive first and second sinusoidal signals, and to receive first and second phase signals, the demodulator generating an error signal;

an amplifier connected to receive the error signal, the amplifier amplifying the error signal by a gain factor to generate an amplified error signal;

an integrator connected to receive the error signal, the integrator integrating the error signal to generate an integrated error signal;

a summer connected to receive both the amplified error signal and the integrated error signal, the summer generating a summation signal;

a second integrator connected to receive the summation signal and to perform an integration of the summation signal to generate an output phase error signal; and a feedback loop connected to receive the output phase error signal and to generate the first and second phase signals from the output phase error signal, wherein the demodulator generates the error signal by generating a first error signal ed, where ed=Vcos*Cos(phase)+Vsin*Sin(phase), and where Vcos and Vsin are sinusoidal voltage signals;

generates a quadrature error signal eq, where eq−Vcos*Sin(phase)+Vsin*Cos(phase);

generates a second error signal ec, where ec=ed, when the quadrature error signal eq is less than or equal to zero, where ec=ed+3*eq, when ed is greater than or equal to zero and eq is greater than zero, and where ec=ed−3*eq, when ed is less than zero and eq is greater than zero; and uses the second error signal as the error signal output by the demodulator.

6. The phase lock loop of claim 5, wherein the first and second phase signals are a cosine and a sine of the output phase error signal.

7. The phase lock loop of claim 5, wherein the first and second sinusoidal voltage signals are derived from an electrical generator.

8. A method for capturing and locking the phases two signals, comprising the steps of:

generating a first displacement error signal ed representing a first displacement error between first and second signals, where ed=Vcos*Cos(phase)+Vsin*Sin(phase), and where Vcos and Vsin are sinusoidal voltage signals;

generating a quadrature error signal eq representing a quadrature error between the first and second signals, where eq=−Vcos*Sin(phase)+Vsin*Cos(phase);

generating a second displacement error signal ec representing a second displacement error between the first and second signals, where ec=ed, when the quadrature error signal eq is less than or equal to zero, where ec=ed+X*eq, when ed is greater than or equal to zero and eq is greater than zero, and where ec=ed−X*eq, when ed is less than zero and eq is greater than zero, where X is a multiplication factor; and determining an overall error between the first and second signals using the second displacement error signal.

9. The method of claim 8, wherein X is 3.

10. The method of claim 8, wherein the sinusoidal voltage signals Vcos and Vsin are approximately 90 degrees apart.

11. The method of claim 8, wherein the step of determining is performed by the steps of:

providing the second displacement error signal ec to a proportional path where the error signal ec is amplified by a gain factor;

providing the second displacement error signal cc to an integral path where the error signal ec is integrated;

summing the amplified and integrated signals to generate a summed signal; and performing a second integration of the summed signal to generate an output indicative of the error in the phase-lock loop.

12. A phase lock loop for locking phases of first and second sinusoidal signals, comprising:

a demodulator connected to receive the first and second sinusoidal signals, and to receive first and second phase signals, the demodulator generating an error signal;

an amplifier connected to receive the error signal, the amplifier amplifying the error signal by a gain factor to generate an amplified error signal;

an integrator connected to receive the error signal, the integrator integrating the error signal to generate an integrated error signal;

a summer connected to receive both the amplified error signal and the integrated error signal, the summer generating a summation signal;

a second integrator connected to receive the summation signal and to perform an integration of the summation signal to generate an output phase error signal; and a feedback loop connected to receive the output phase error signal and to generate the first and second phase signals from the output phase error signal, wherein the demodulator generates the error signal by generating a first error signal ed, where ed=Vcos*Cos(phase)+Vsin*Sin(phase), and where Vcos and Vsin are the first and second sinusoidal voltage signals;

generates a quadrature error signal eq, where eq−Vcos*Sin(phase)+Vsin*Cos(phase);

generates a second error signal ec, where ec=ed, when the quadrature error signal eq is less than or equal to zero, where ec=ed+3*eq, when ed is greater than or equal to zero and eq is greater than zero, and where ec=ed−3*eq, when ed is less than zero and eq is greater than zero; and uses the second error signal as the error signal output by the demodulator.

13. The phase lock loop of claim 12, wherein the first and second phase signals are a cosine and a sine of the output phase error signal.

14. The phase lock loop of claim 12, wherein the first and second sinusoidal voltage signals are derived from an electrical generator.

* * * * *